United States Patent
Wang et al.

(10) Patent No.: US 8,917,562 B2
(45) Date of Patent: Dec. 23, 2014

(54) BODY VOLTAGE SENSING BASED SHORT PULSE READING CIRCUIT

(71) Applicant: The Regents of the University of California, Oakland, CA (US)

(72) Inventors: Kang-Lung Wang, Santa Monica, CA (US); Chih-Kong K. Yang, Pacific Palisades, CA (US); Dejan Markovic, Los Angeles, CA (US); Fengbo Ren, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/088,635

(22) Filed: Nov. 25, 2013

(65) Prior Publication Data
US 2014/0153325 A1 Jun. 5, 2014

Related U.S. Application Data

(63) Continuation of application No. PCT/US2012/056136, filed on Sep. 19, 2012.

(60) Provisional application No. 61/536,164, filed on Sep. 19, 2011.

(51) Int. Cl.
*G11C 7/06* (2006.01)
*G11C 13/00* (2006.01)
*G11C 11/16* (2006.01)

(52) U.S. Cl.
CPC ............ *G11C 11/1673* (2013.01); *G11C 7/062* (2013.01); *G11C 13/0004* (2013.01); *G11C 11/16* (2013.01); *G11C 13/0007* (2013.01); *G11C 2207/063* (2013.01); *G11C 2013/0054* (2013.01); *G11C 13/004* (2013.01)

USPC ............... 365/189.15; 365/158; 365/189.06; 365/189.07

(58) Field of Classification Search
USPC ............... 365/158, 189.15, 189.06, 189.07
See application file for complete search history.

(56) References Cited

U.S. PATENT DOCUMENTS 7,209,380 B2 * 4/2007 Ezaki et al. .................... 365/158
7,272,034 B1 9/2007 Chen et al.
(Continued)

FOREIGN PATENT DOCUMENTS

WO 2008-109768 A1 9/2008
WO 2013-043738 A1 3/2013

OTHER PUBLICATIONS

Gogl, et al. "A 16-Mb MRAM Featuring Bootstrapped Write Drivers," IEEE Journal of Solid-State Circuits, vol. 40, No. 4, Apr. 2005, pp. 902-908.

(Continued)

*Primary Examiner* — Hoai V Ho
*Assistant Examiner* — Jay Radke
(74) *Attorney, Agent, or Firm* — John P. O'Banion

(57) ABSTRACT

As memory geometries continue to scale down, current density of magnetic tunnel junctions (MTJs) make conventional low current reading scheme problematic with regard to performance and reliability. A body-voltage sense circuit (BVSC) short pulse reading (SPR) circuit is described using body connected load transistors and a novel sensing circuit with second stage amplifier which allows for very short read pulses providing much higher read margins, less sensing time, and shorter sensing current pulses. Simulation results (using 65-nm CMOS model SPICE simulations) show that our technique can achieve 550 mV of read margin at 1 ns performance under a 1 V supply voltage, which is greater than reference designs achieve at 5 ns performance.

20 Claims, 13 Drawing Sheets

(56) References Cited

U.S. PATENT DOCUMENTS

| 7,800,942 B2 | 9/2010 | Chen et al. | |
|---|---|---|---|
| 2006/0120145 A1* | 6/2006 | Ezaki et al. | 365/158 |
| 2009/0213640 A1 | 8/2009 | Chen et al. | |
| 2010/0034017 A1 | 2/2010 | Rivkin et al. | |
| 2010/0321976 A1 | 12/2010 | Jung et al. | |

OTHER PUBLICATIONS

Kim, et al. "A Novel Sensing Circuit for Deep Submicron Spin Transfer Torque MRAM (STT-MRAM)," IEEE Transactions on Very Large Scale Integration (VLSI) Systems, vol. 20, No. 1, Jan. 2012, pp. 181-186.

Kim, et al. "A 45nm 1Mb Embedded STT-MRAM with design techniques to minimize read-disturbance," 2011 Symposium on VLSI Circuits Digest of Technical Papers, pp. 296-297.

Na et al. "An Offset-Canceling Triple-Stage Sensing Circuit for Deep Submicrometer STT-RAM," Jan. 2, 2014, Very Large Scale Integration (VLSI) Systems, IEEE Transactions on (vol. 22 , Issue: 7 ) pp. 1620-1624.

Koike and Endoh, "A New Sensing Scheme with High Signal Margin Suitable for Spin-Transfer Torque RAM," VLSI Technology, Systems and Applications (VLSI-TSA), 2011 International Symposium on Apr. 25-27, 2011, pp. 1-2.

Sun et al. "Voltage Driven Nondestructive Self-Reference Sensing Scheme of Spin-Transfer Torque Memory," IEEE Transactions on Very Large Scale Integration (VLSI) Systems, vol. 20, No. 11, Nov. 2012, pp. 2020-2030.

Chen and Li, "Emerging Sensing Techniques for Emerging Memories," Design Automation Conference (ASP-DAC), 2011 16th Asia and South Pacific on Jan. 25-28, 2011, pp. 204-210.

Kim et al. "STT-MRAM Sensing Circuit With Self-Body Biasing in Deep Submicron Technologies," Very Large Scale Integration (VLSI) Systems, IEEE Transactions on (vol. 22 , Issue: 7), Jul. 31, 2013, pp. 1-5.

Jang et al., "A sensing circuit for MRAM based on 2MTJ-2T structure," Original version presented at the 10th Korean Conference on Semiconductors, Seoul, Korea, Feb. 27-28, 2003, (Current Applied Physics 4 (2004)) pp. 19-24.

Korean Intellectual Property Office, International Search Report and Written Opinion issued on Feb. 27, 2013 for corresponding international patent application No. PCT/UC2012/056136 (pp. 1-9) with claims searched (10-14) pp. 1-14.

* cited by examiner

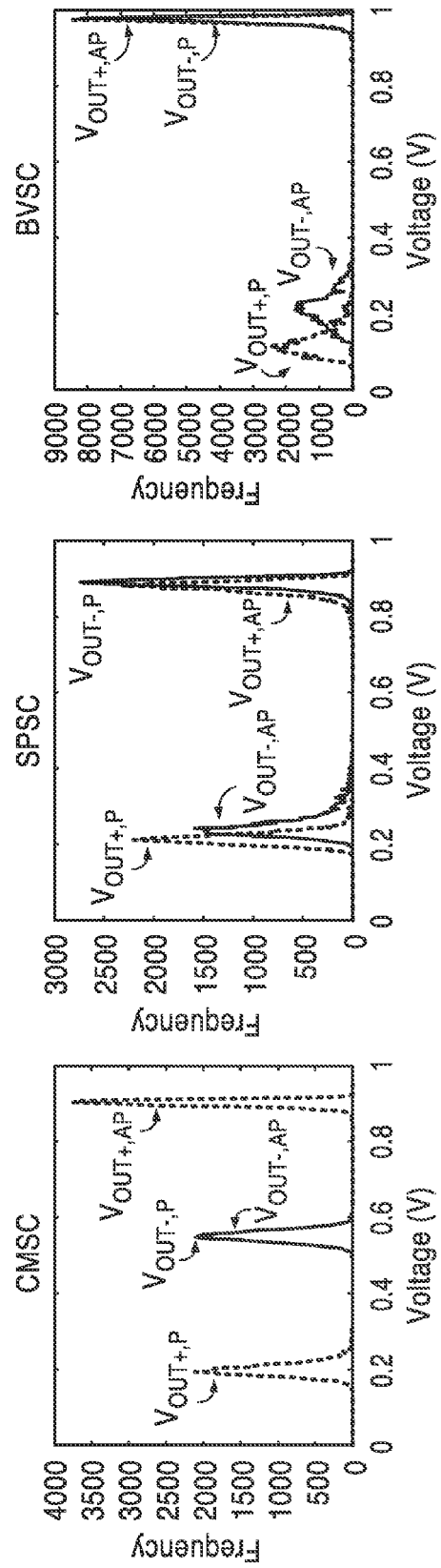

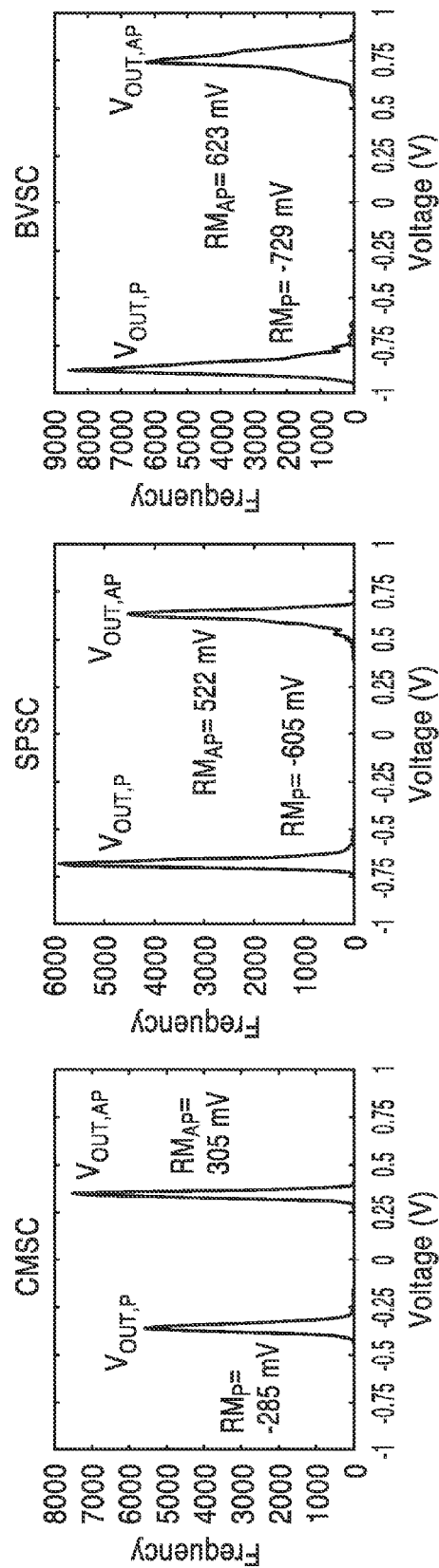

BODY VOLTAGE SENSING BASED SHORT PULSE READING CIRCUIT

CROSS-REFERENCE TO RELATED APPLICATIONS

This application is a 35 U.S.C. §111(a) continuation of PCT international application number PCT/US2012/056136 filed on Sep. 19, 2012, incorporated herein by reference in its entirety, which is a nonprovisional of U.S. provisional patent application Ser. No. 61/536,164 filed on Sep. 19, 2011, incorporated herein by reference in its entirety. Priority is claimed to each of the foregoing applications.

The above-referenced PCT international application was published as PCT International Publication No. WO 2013/043738 on Mar. 28, 2013, which publication is incorporated herein by reference in its entirety.

STATEMENT REGARDING FEDERALLY SPONSORED RESEARCH OR DEVELOPMENT

This invention was made with Government support of Grant Number HR0011-09-C-0114, awarded by the Defense Advanced Research Projects Agency. The Government has certain rights in the invention.

INCORPORATION-BY-REFERENCE OF MATERIAL SUBMITTED IN A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to resistance-sensing based random access memory (RAM) devices, and more particularly to a short pulse reading (SPR) circuit implementation based on a body-voltage sensing circuit (BVSC).

2. Description of Related Art

Research efforts in the memory industry have continued towards providing a scalable "universal memory". Among many candidates, are (1) phase-change RAM (PC-RAM) which has been shown to be a good replacement for Flash memory; (2) resistive RAM (ReRAM) which is in its initial stage of exploration; (3) magnetoresistive RAM (MRAM); and (4) spin-torque transfer RAM (STT-RAM) which has been regarded as the front runner.

It has been demonstrated that STT-RAM can achieve smaller cell size than static RAM (SRAM), greater performance than dynamic RAM (DRAM), the non-volatility of Flash and improved endurance that is on the order of $10^{16}$ read/write cycles. Compared to MRAM, another advantage of STT-RAM is that the switching current of its storage device, a magnetic tunnel junction (MTJ), scales with device size due to the nature of spin-torque transfer. As a result, both the CMOS and MTJ devices appear promising for being further scaled down in advanced STT-RAM technology node toward realizing higher memory density and lower power consumption. Although, scaling reduces the critical current density ($J_C$) of the MTJ and increases the variability of both devices, impeding the reading operations from being reliable and high speed.

Existing reading circuit designs typically adopt the low current reading (LCR) scheme, in which a sensing current smaller than the writing current is applied on the selected MTJ to avoid read disturbance. FIG. 1 shows a current-mirror sensing circuit (GMSC). This design adds an equalizer to the current mirror sense amplifier outputs to mitigate the issues of the imbalanced output impedance and the skewed sensing time of reading $R_P$ and $R_{AP}$. FIG. 2 shows a split-path sensing circuit (SPSC). This design implements a double current-mirror based differential amplifier by splitting the sensing current into two paths and mirroring them differentially to improve its output signal swing and read margin (RM). Both of the above designs utilize the LCR scheme.

In the LCR based sensing circuit designs, the sensing current is strictly bounded by the long duration switching current ($I_C$) of the MTJ. Consequently, $J_C$ scaling would eventually create difficulty in achieving high reading speed for this sensing scheme. To solve this problem, a short pulse reading (SPR) method has been considered which uses a sensing current similar to the writing current in magnitude, but with a much shorter pulse width, to read the MTJ.

However, no circuit implementations of a short pulse reading (SPR) scheme has been advanced, and no answers have arisen as to the best circuit structure to implement an SPR based high-performance STT-RAM.

BRIEF SUMMARY OF THE INVENTION

A short pulse reading (SPR) circuit implementation based on a body-voltage sensing circuit (BVSC) is disclosed for a memory device, such as but not limited to, phase-change RAM (PC-RAM), magnetoresistive RAM (MRAM), resistive RAM (ReRAM) and spin-torque transfer RAM (STT-RAM). For the sake of simplicity of illustration, the examples provided herein are optimized for STT-RAM. The inventive short pulse reading (SPR) circuit is based on a body-voltage sensing circuit (BVSC) that compares the voltage signal associated with the memory cell state with a reference voltage, with the output capturing by a latch. The BVSC comprises a data sensor, a reference sensor and a second-stage sense amplifier. The resistance sensors adopt a body-voltage sensing scheme by using body-connected PMOS transistors as load devices. This reading circuit is a viable solution for the high-speed and reliable reading of resistance-sensing based RAM devices, including but not restricting to PC-RAM, MRAM, ReRAM, and STT-RAM, especially for future scaled STT-RAM. The reading circuit features large sensing margin, high sensing speed with a short current pulse applied on the resistive storage device. These features show promise toward eliminating read disturbance and supporting the aggressive scaling required of future low-power and high-performance non-volatile memories (e.g., STT-RAM).

By way of example and not limitation, this SPR circuit is simulated in 65 nm Spice simulations. The following sections analyze the read margin (RM) and performance of the inventive BVSC and compare them to those of the two reference designs, specifically CMSC and SPSC. Departing from CMSC and SPSC designs, BVSC utilizes the unique small signal resistance of the body-connected load to achieve higher sensing margin (SM), or equivalently, higher sensing speed for the same SM. This leads to a shorter sensing current pulse applied on the resistive storage device, which significantly reduces read disturbance probability, thus increasing read reliability.

Simulation results show that the body-connected load used in BVSC enables the three-fold improvement in sensing margin provided by the inventive reading circuit, as compared to conventional diode-connected load circuits found in CMSC and SPSC. As a result, BVSC substantially outperforms the reference designs in sensing speed and read margin (RM). With a similar amount of sensing current applied on the storage device, BVSC can achieve a RM as high as 300 mV under a 1 V supply in only 0.78 ns of sensing time, while the reference designs require 4.3 ns and 2.3 ns to achieve a RM of 200 mV, respectively. This indicates that BVSC provides a three to five times greater sensing speed. On the other hand, to achieve a 200 mV SM, the sensing time required for CMSC, SPSC, and BVSC is 4.33 ns, 2.25 ns and 0.65 ns respectively. In other words, the SM at 1 ns performance in the inventive sensing circuit is better than the SM at 5 ns performance in prior art.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 10A through FIG. 10F are graphs of sensing voltage distributions for CMSC, SPSC and BVSC as single-ended output and differential output.

DETAILED DESCRIPTION OF THE INVENTION

1. High Speed Reading of STT-RAM 1.1. MTJ Switching

In this section, the STT-RAM is used as an application example of the inventive reading circuit, however, the inventive read circuit is not limited to application within STT-RAM devices. One of ordinary skill in the art will recognize that the inventive reading circuit may be applied in any memory device in which the memory states are determined in response to different resistance levels.

The key memory device in STT-RAM devices is the magnetic tunnel junction (MTJ), which has two ferromagnetic layers separated by a thin, nonconductive tunneling barrier. The thicker layer, called the fixed layer (or pinned layer), has a certain layer stack structure fixing its magnetic orientation. The thinner layer, whose magnetic orientation can be changed freely, is called the free layer. The MTJ exhibits two resistive states determined by the relative magnetization directions of the fixed and the free layers: a parallel (P) orientation produces a low resistance ($R_P$) and an anti-parallel (AP) orientation results in a high resistance ($R_{AP}$). The resistance difference between the two states is measured by tunnel magneto-resistance ratio (TMR), which is defined as $(R_{AP}-R_P)/R_P$. TMR measures how well the two resistive states can be distinguished, so higher TMR is usually preferred in reading operations.

Figures 3A, 3B:
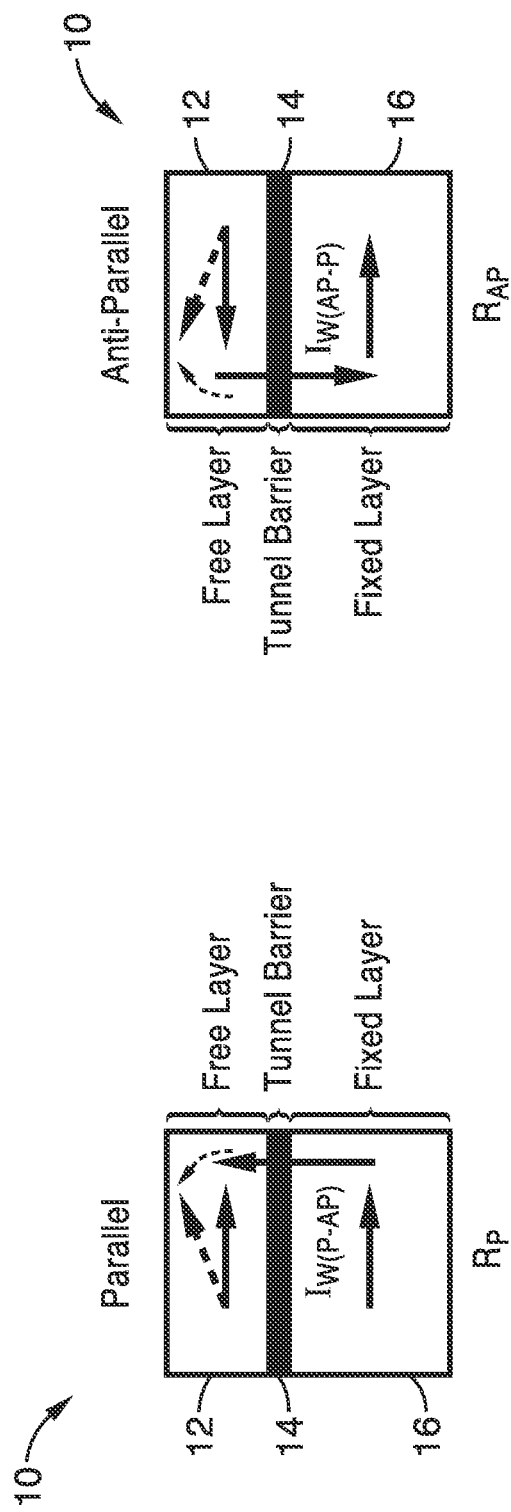
FIG. 3A and FIG. 3B are schematics of a magnetic-tunnel junction (MTJ) in parallel and anti-parallel resistance states with illustration of the corresponding switching current direction.

FIG. 3A and FIG. 3B illustrate a basic magnetic tunnel junction (MTJ) structure 10 with free layer 12 and fixed layer 16 separated by a thin nonconductive tunnel barrier 14. The parallel state (P) is depicted in FIG. 3A with current $I_{W(P-AP)}$ and the anti-parallel (AP) state is depicted in FIG. 3B with current $I_{W(AP-P)}$.

Similar to MRAM, the STT-RAM stores digital information in MTJs as a magnetic form with "0" and "1" represented as different magnetization directions of the free layer. Switching of the MTJ is carried out by applying a bi-directional writing current to the device. The current flows in the direction from the fixed (free) to the free (fixed) layer writes the MTJ into the AP (P) state as seen in the comparison of FIG. 3A and FIG. 3B.

Figure 4B:
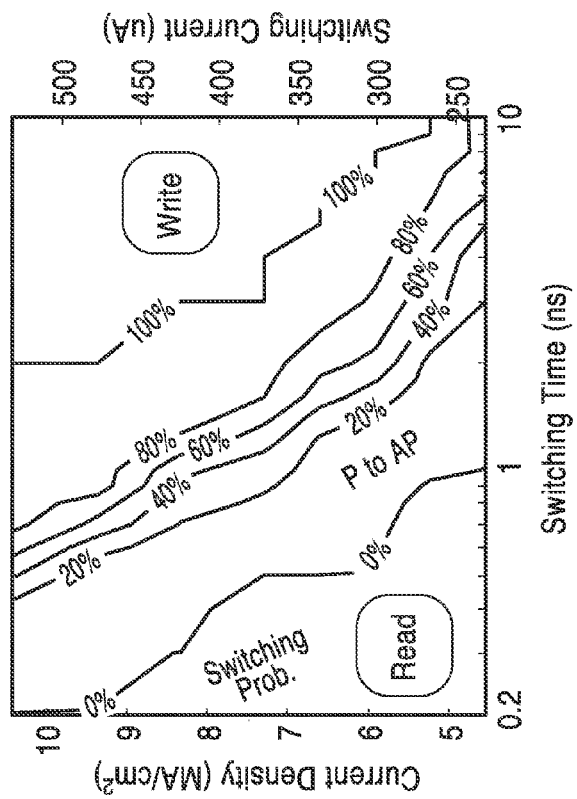
FIG. 4A and FIG. 4B are contour plots of MTJ switching probability in response to switching current density, and switching time.
Figure 4A:
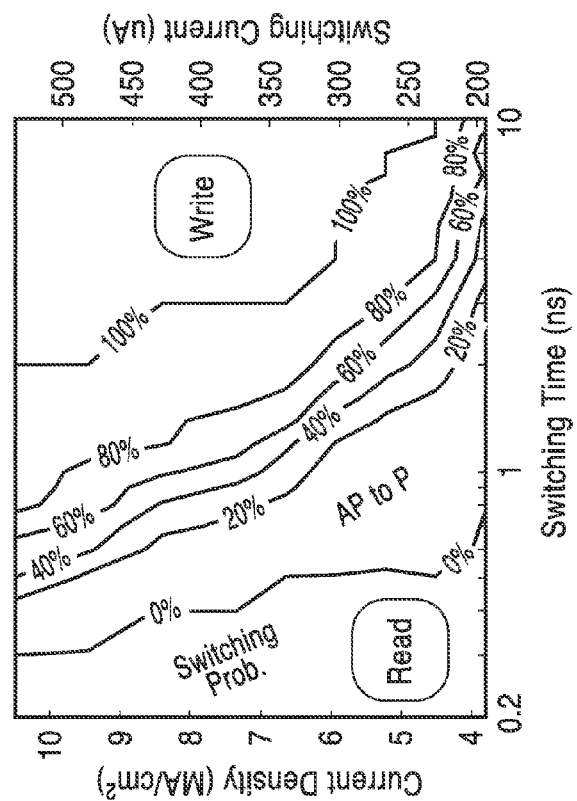

FIG. 4A and FIG. 4B depict typical switching characteristic of the MTJ for the AP to P switching in FIG. 4A, and for the P to AP switching in FIG. 4B. The contours of the switching probabilities, shown here at 20% intervals, indicates the current density required for a certain switching probability as a function of the switching time, or equivalently, the pulse width of the switching current. It is also noted that AP to P and P to AP switching are usually asymmetric, for example P to AP switching requires higher current density for the same switching probability. The value $J_C$ typically refers to the current density required to reach a 100% switching probability, and the critical current ($I_C$) is calculated as $J_C$ times the junction area.

1.2. Need for Short Pulse Reading (SPR).

The MTJ switching characteristic of FIG. 4A and FIG. 4B, described above, are for MTJ with a free layer stack of $Co_{60}Fe_{20}B_{20}$ and a size of 50 nm by 130 nm. In STT-RAM, the reading operation is performed by sensing the resistance of the MTJ using a sensing current. Implied by FIG. 4A-4B, In STT-RAM design, the writing current distribution should stay above the 100% region (FIG. 4) to guarantee successful writing. Similarly, the sensing current distribution has to be kept below the 0% region (FIG. 4) to avoid accidental switching (read disturbance). The conventional LCR scheme avoids the read disturbance by keeping the read-current amplitude substantially below $I_C$. Typical writing currents today are in the 300-500 μA range and reading with ⅓ or ⅕ of the write current is still feasible. However, scaled MTJs would need to operate with writing currents on the order of tens of microamps, making LCR impractical for fast reading. Alternatively, the SPR scheme uses a higher sensing current amplitude with a shorter duration to effectively improve the sensing speed without risking a read disturbance. Stated another way, a sensing current generated during a read pulse can approximate current magnitude utilized when writing to the memory cell with a write pulse, yet width of the read pulse is less than or equal to about one-tenth of the write pulse width. As a result, the SPR scheme is of great interest for designing fast and reliable reading circuits for future memories, such as STT-RAMS.

2. Design of High-Speed SPR Circuit

2.1. SPR Architecture

Figure 5:
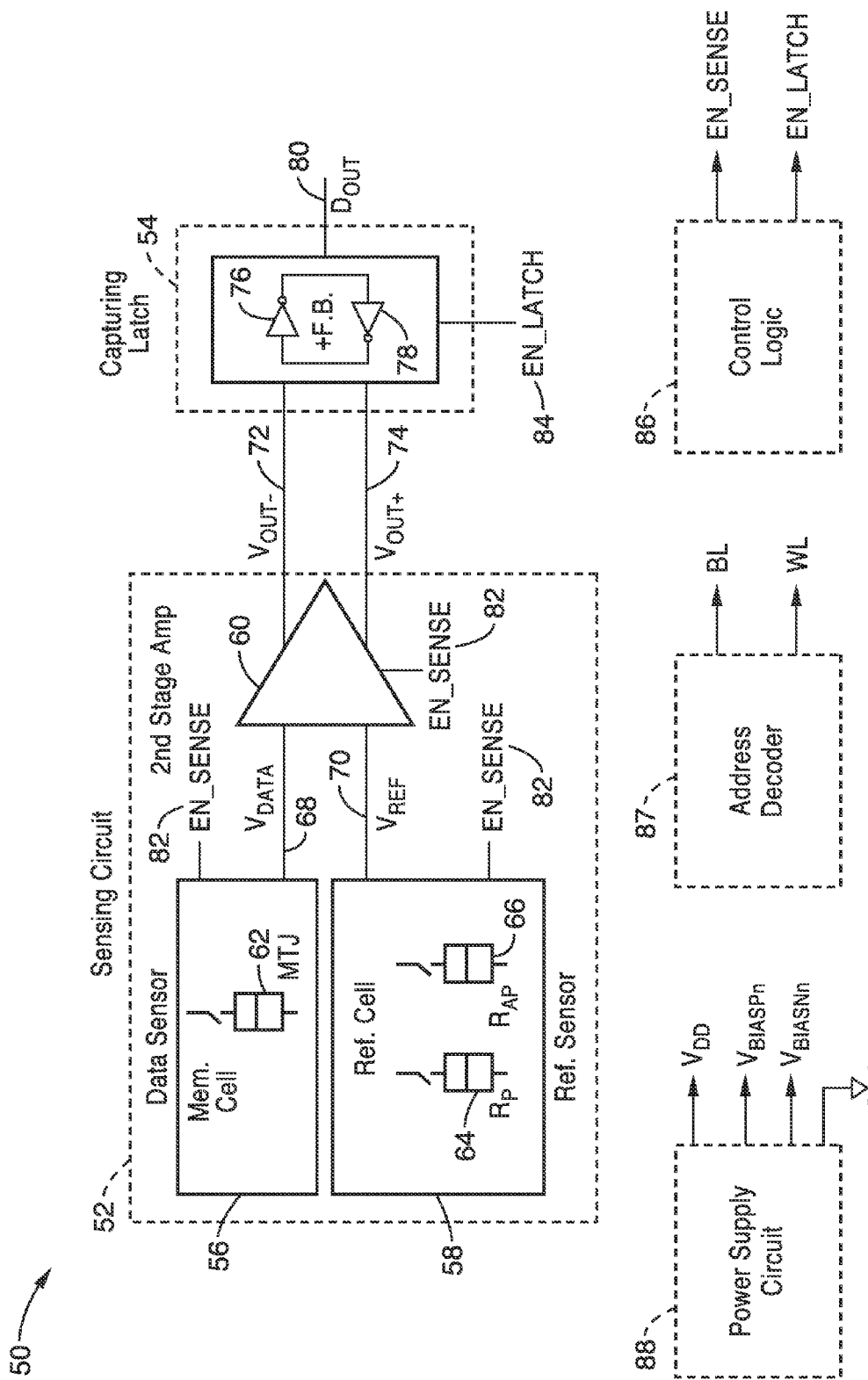
FIG. 5 is a block diagram of a short pulse reading (SPR) circuit according to an embodiment of the present invention.

FIG. 5 illustrates an example embodiment 50 of an SPR circuit according to at least one implementation of the present invention. A sensing circuit 52 is shown with capturing latch 54. A data sensor 56 is shown with memory cell 62, and a reference cell 58, showing the two state $R_P$ 64 and $R_{AP}$ 66. It should be appreciated that the reference sensor preferably outputs a signal which is an average of these two states as would be read by the data sensor. A reading circuit senses the resistance of the MTJ, and translates it into a voltage signal at the output in order to read out the data. The key concept of the SPR is to carry out this process with only a short pulse of the sensing current applied on the memory device. From the device perspective, the shorter the pulse, the shorter the sensing time, and the lower the chance a read disturbance may happen. Therefore, the present SPR structure of FIG. 5 utilizes strong positive feedback to minimize the pulse width of the sensing current. The sensing circuit uses voltage sensing which converts MTJ resistance into a voltage signal that has two levels, and uses a reference signal which is an average voltage of the two memory cell states, to which the voltage sensing can be compared.

At least one SPR embodiment has a second stage amplifier 60 in the sensing circuit which uses differential inputs $V_{DATA}$ 68 and $V_{REF}$ 70 that measure MTJ resistance (between data and a reference) and differential outputs $V_{OUT-}$ 72 and $V_{OUT+}$ 74, followed by a capturing latch 54 utilizing positive feedback with gates 76, 78 and generating a data output $D_{OUT}$ 80. The elements of the sensing circuit are shown enabled by signal EN_SENSE 82, while the latch is enabled by EN_LATCH 84.

It should be appreciated that this sensing circuit utilizes a voltage sensing scheme, with a data sensor for converting MTJ resistance into a voltage signal with $V_{DATA}=V_H,V_L$ in response to reading $R_{AP}$ and $R_P$, respectively, and a reference sensor that average $V_H$ and $V_L$ to generate reference voltage $V_{REF}$; for example $V_{REF}=(V_H+V_L)/2$. A second stage sense amplifier 60 compares $V_{DATA}$ with $V_{REF}$ to generate an output voltage, such as the differential pair $V_{OUT-}$ and $V_{OUT+}$. A positive feedback capturing latch converts the sensed comparison, represented by $V_{OUT-}$ and $V_{OUT+}$, to generate a binary data output signal $D_{OUT}$. Thus, the data stored on the MTJ will be reflected by the differential output below described for reading $R_{AP}$ and $R_P$ respectively as follows.

$$V_{OUT}=V_{DATA}-V_{REF}(V_{OUT,AP}>0 \text{ for } R_{AP}; V_{OUT,P}<0 \text{ for } R_P)$$

It should be appreciated that memory devices have various forms of control logic (internal and/or external) for generating control signals to operate the memory device. In FIG. 5 a control logic block 86 is depicted for generating control signals, that are shown by way of example and not limitation, as comprising EN_SENSE 82, EN_LATCH 84, and other necessary control signals (not shown for the sake of simplicity of illustration), as conventionally utilized in a memory device.

It should be similarly appreciated that memory devices have address decoders for selecting memory cells for reading and writing. In FIG. 5 an address decoder 87 is depicted, and shown by way of example and not limitation as generating bit lines (BL) and write lines (WL).

It should also be appreciated that memory devices also have power supply circuitry (internal and/or external) for supplying internal power requirements. In FIG. 5 a power supply circuit is represented by block 88, shown by way of example and not limitation, as generating voltages $V_{DD}$, Gnd, various transistor bias voltages summarized as $V_{BIASPn}$ (e.g., bias for PMOS transistors), and $V_{BIASNn}$ (e.g., bias for NMOS transistors) as necessary within any given memory device.

Figure 6:
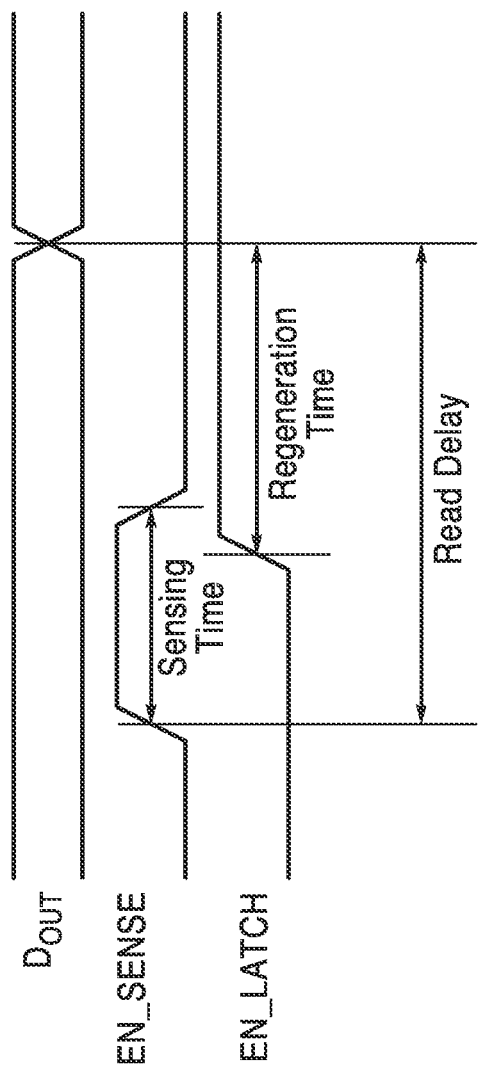
FIG. 6 is a timing diagram for the operation of a short pulse reading (SPR) circuit shown in FIG. 5.

FIG. 6 illustrates a timing diagram for the example SPR STT-RAM of FIG. 5, showing the signals EN_SENSE (sensing activation signal), EN_LATCH (latching activation signal) and output $D_{OUT}$. Instead of waiting for $V_{OUT}$ to completely settle, the capturing latch is enabled to regenerate the final output, once $V_{OUT}$ with sufficient RM has been established. Then the sensing circuit is disabled for the rest of the reading operation to cut off the sensing current thereby minimizing its pulse width. As can be seen in the diagram, sensing is enabled by activating EN_SENSE for a sensing time before EN_LATCH after which output $D_{OUT}$ is available following a read delay from EN_SENSE and a regeneration time after EN_LATCH. More particularly, the sensing circuit is first enabled (e.g., activate EN_SENSE 82), and its outputs commences to differentiate from each other according to the resistance of the MTJ. Instead of waiting for the output to completely settle, the sensing circuit is disabled (e.g., deactivate EN_SENSE 82) once an output voltage large enough to be resolved correctly has been established. At the same time, the positive feedback block is also enabled (e.g., activate EN_LATCH 84) to latch the data. As a result, the sensing circuit only needs to be active for a short period of time, which is the sensing time, also known as the pulse width of the sensing current. In order to minimize the sensing time, the sensing circuit should be optimized for both gain and speed.

Theoretically, the positive feedback of the sensing circuit has infinite gain, meaning it should be able to resolve any arbitrarily small voltage difference. In reality, the resolution (minimum resolvable voltage difference of the inputs) is limited by the mismatch of transistors and noise. So, using the positive feedback block as the final data latch allows disabling the sensing circuit to terminate the sensing current earlier during the read.

2.2. Body-Voltage Sensing Circuit (BVSC)

During the reading operation, one of the memory cells is connected to the sensor circuit through the column multiplexor (mux) device. A sensing current ($I_{MTJ}$) is generated by applying a voltage on the (bit-line) BL of the cell. This sensing current can be converted into a voltage signal ($V_{DATA}$) using a load transistor. Thus, it is critical in designing the sensor circuit to choose the optimum load. In the sensing circuit, the sensing signal $V_{DATA}$ $V_{DATA}$ is converted from the sensing current ($I_{MTJ}$) through a load network. The swing of $V_{DATA}$ has to be sufficiently large to suppress device mismatches and noise.

There are two considerations in determining the optimum load. First, the optimum load should be able to maximize the following relation.

$$\Delta V = V_H - V_L = (I_{MJT,P} - I_{MJT,AP}) \cdot R_{LOAD} \quad (1)$$

In the above relation, $R_{LOAD}$ is the small signal resistance of the load transistor. This seems to require $R_{LOAD}$ to be as large as possible. However, this is not true when variation of the MTJ is taken into account. The MTJ exhibits variation in both the resistance-area (RA) product and TMR due to the tunnel barrier thickness and geometry variation induced in the fabrication process, resulting in variations on both $R_P$ and $R_{AP}$. Consequently, $V_H$ and $V_L$ also have variations, in which the variation range is proportional to $R_{LOAD}$. Consider the following which defines sensing margin (SM) to be a statistical measure of the margin between $V_H$ and $V_L$.

$$SM = \mu(V_H - V_L) - 3\sigma(V_H - V_L) \quad (2)$$

It should be noted that the higher $R_{LOAD}$ is, the larger $\mu(V_H - V_L)$ becomes, however, a wider $V_H$ and $V_L$ distribution spread also means $\sigma(V_H - V_L)$ increases. The primary design objective is then to maximize SM, not simply its mean. Further increasing $R_{LOAD}$ beyond some point eventually deteriorates SM, since a higher $R_{LOAD}$ also amplifies the variance of the sensing signal. In addition, a load device with large $R_{LOAD}$ is not desirable for SPR as it introduces a large RC time constant, limiting sensing speed. As a result, increasing $R_{LOAD}$ does not always increase SM. In order to maximize SM, the $R_{LOAD}$ must be optimized and neither too large nor too small. The second consideration, from a SPR perspective, is that the sensor circuit should have a high sensing speed. This requires the sensor circuit to have a large bandwidth, and thereby a small $R_{LOAD}$.

Figure 7A:
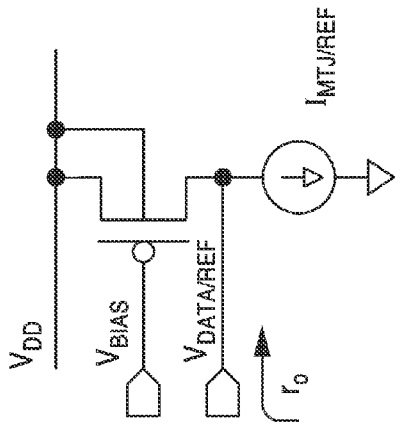
FIG. 7A through FIG. 7D are schematics of transistor load types and their small signal resistance, shown are diode connected load, current source load, current mirror load, and body-connected load.
Figure 7B:
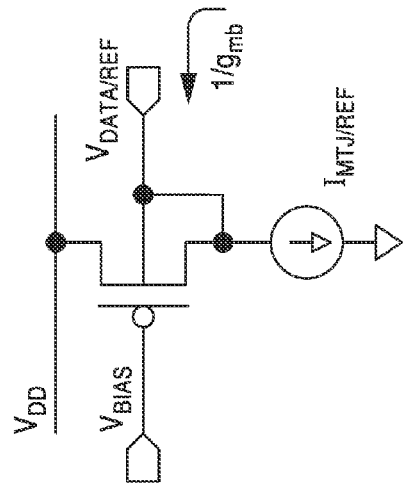
Figure 7C:
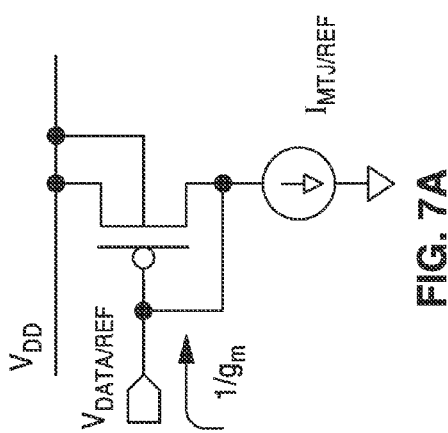
Figure 7D:
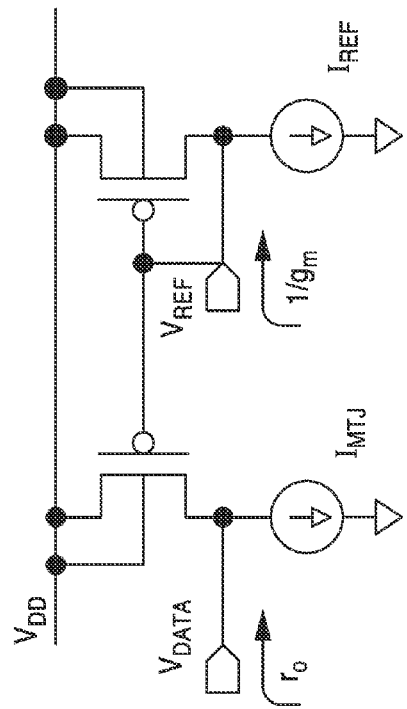

FIG. 7A through FIG. 7D illustrate examples of four different types of transistor loads and their small signal resistance. FIG. 7A depicts a diode-connected load, FIG. 7B shows a current source load, FIG. 7C is a current mirror load, and FIG. 7D depicts a body-connected load. The loads seen in FIG. 7A through FIG. 7C are different types of loads that are in common use. The equivalent resistances of these load types are shown as the curving arrow indicating input resistance. From the discussion above, it should be realized that none of these loads are ideally suited for the SPR. For example, the diode connected load in FIG. 7A has a low impedance equal to $1/g_m$ resulting in a value for SM that is inadequate. The current source load of FIG. 7B has a very high impedance equal to $r_o$, whereby the output voltage is too sensitive to MTJ variation, and also restricts sensor circuit bandwidth. Using the current mirror load of FIG. 7C, that includes both the diode-connected and current source load, allows for the sensing and amplification to be performed in the same stage, however, the impedance imbalance of the two load types results in too slow of a speed with large settling time.

To overcome these imperfections, the body-connected load is utilized as shown in FIG. 7D, in which the body (e.g., n-well) and drain terminal of a PMOS transistor are connected together, to better realize the sensor circuit in the SPR structure. The body-connected load also has low impedance that is equal to $1/g_{mb}$. As compared to the diode-connected load ($R_{LOAD} = 1/g_m$), the body-connected load turns out to have an $R_{LOAD}$ that is several times larger in general, due to the fact that the body voltage is weaker at tuning the current than the gate voltage is ($g_{mb} < g_m$). Consequently, using the body-connected load in the sensor circuits can effectively increase SM without sacrificing the speed advantage of low impedance load. Since this sensor circuit senses the MTJ resistance with the body voltage of the load transistor as output, this sensing scheme is referred to as body voltage sensing.

Figure 8:
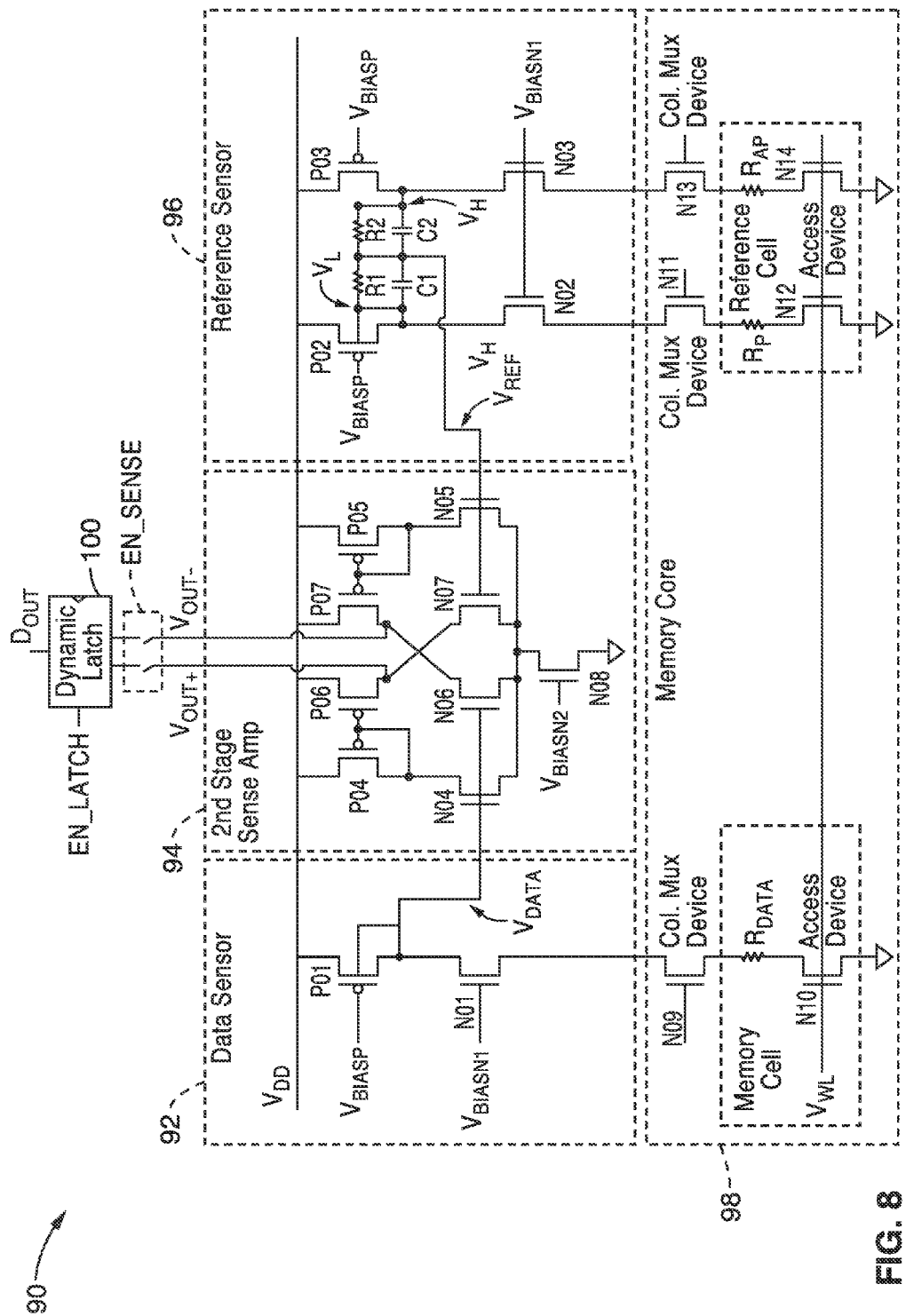
FIG. 8 is a schematic of a body voltage sensing circuit (BVSC) according to an embodiment of the present invention.

FIG. 8 illustrates an example of a body voltage based sense circuit (BVSC) SPR memory circuit embodiment 90, comprising a data sensor 92, a second stage sense amplifier 94, and a reference sensor 96, with memory core 98 showing a memory cell on the left side and a reference cell on the right side. The data sensor of the sensing circuit applies a sensing current to the memory cell (through a column mux device), in which the data is stored as the resistance state of the memory device, $R_P$ (low resistance) or $R_{AP}$ (high resistance) to generate $V_L$ or $V_H$ in response to sensing. The sensor circuitry includes a body connected PMOS load (P01) and a NMOS clamp transistor (N01), biased by $V_{BIASP}$ and $V_{BIASN1}$ respectively, cascading with the column mux device for controlling sensing current and shielding BL voltage from the voltage variation at node $V_{DATA}$. The body terminal of P01 is connected to its drain terminal so that the sensing current, which reflects $R_{DATA}$, can be modulated into the body voltage of P01 ($V_{DATA}$). For best performance, P01 and N01 should be biased at the proper voltage levels.

The reference circuit applies sensing current to reference cells (through the column mux device), in which one memory device is in a low-resistance state $R_P$ and the other one is in a high-resistance state $R_{AP}$. The reference circuit includes two sensing circuits (P02, N02, and P03, N03), biased by $V_{BIASP}$ and $V_{BIASN1}$ respectively. One sensing circuit constantly reads $R_P$, and the other one constantly reads $R_{AP}$. A voltage divider consisting of two resistors ($R_1$, $R_2$) and two capacitors ($C_1$, $C_2$) divides their body voltage outputs to generate a reference voltage $V_{REF} = (R_P + R_{AP})/2$. Therefore, by applying sensing currents to memory and reference cells, the sensing circuit translates $R_{DATA}$ into a body voltage signal $V_{DATA}$, and the reference circuit generates a constant reference voltage $V_{REF}$ so that $V_{DATA} < V_{REF}$ when $R_{DATA} = R_P$ (reading "0"), and $V_{DATA} > V_{REF}$ when $R_{DATA} = R_{AP}$ (reading "1"). The second stage sense amplifier taking $V_{DATA}$ and $V_{REF}$ as inputs used to resolve the output data by amplifying btS=$V_{DATA} - V_{REF}$ differentially. The second stage sense amplifier includes four NMOS input devices (N04-N07), two PMOS current mirror loads (P04-P05), two PMOS output devices (P06-P07) and a NMOS current tail device (N08) biased by $V_{BIASN2}$. Transistors N06, N07 and P06, and P07 are cross-coupled to realize the final differential output of the whole sensing circuit, $V_{OUT} = V_{OUT+} - V_{OUT-}$. In order to obtain optimum speed and gain for the second stage sense amplifier, N08 has to be biased properly. Column multiplexor devices are seen with NMOS devices N09, N11, and N13 operating in combination with NMOS access devices N10, N12 and N14 shown coupled to a write line indicated by signal $V_{WL}$.

The final output usually is followed by a dynamic latch 100 (not part of the second stage amplifier), so that the reading circuit can be turned off, and the output data can be latched once a certain sensing margin at the output nodes is achieved. Dynamic latch 100 is shown receiving signals $V_{OUT-}$ and $V_{OUT+}$. when signal EN_SENSE is activated. Thus, the sensing time and the sensing current pulse width are minimized to realize short pulse reading.

Thus, the body voltage sensing based SPR circuit of FIG. 8 comprises a data sensor having a PMOS body-connected load and a NMOS clamp transistor connecting to the memory cells. The second stage amplifier is preferably implemented using two differential pairs with active current mirrors that are cross-coupled with each other to realize the differential output $V_{OUT-}$ and $V_{OUT+}$. Each of the differential pairs generates one of the differential outputs $V_{OUT-}$ or $V_{OUT+}$. This differential amplifier provides extra signal swing at the outputs, enabling a more reliable and early data regeneration. The $V_{OUT}$ signals are finally regenerated to a full-scale digital signal by the dynamic latch. The inventive body voltage based sensing circuit (BVSC), in which sensing and amplification stages are completely decoupled, has a significant speed advantage primarily in response to: (1) body-connected loads that guarantee a large bandwidth of the sensor circuits; and (2) the amplification stage, which is completely decoupled from the sensing stage, to provide more freedom in tuning the current to optimize performance. It should also be noted that the positive feedback block is preferably implemented using a dynamic latch, which can provide full output swing to digitize the data.

For the sake of simplicity of illustration, FIG. 8 does not depict control logic, address decoding, power supply blocks, or other circuitry, as one of ordinary skill in the art appreciates that memory devices include circuits for generating numerous other necessary digital and analog signals.

The circuit is particularly well-suited for fabrication in complementary metal-oxide semiconductor (CMOS) technology, as a peripheral circuit for high-speed reading of STT-RAM memory. The circuit maintains its advantage over prior art in advanced CMOS nodes (below 32 nm) with MTJ critical currents below 1 mA/cm².

3. Comparison with Reference Designs

Figure 1:
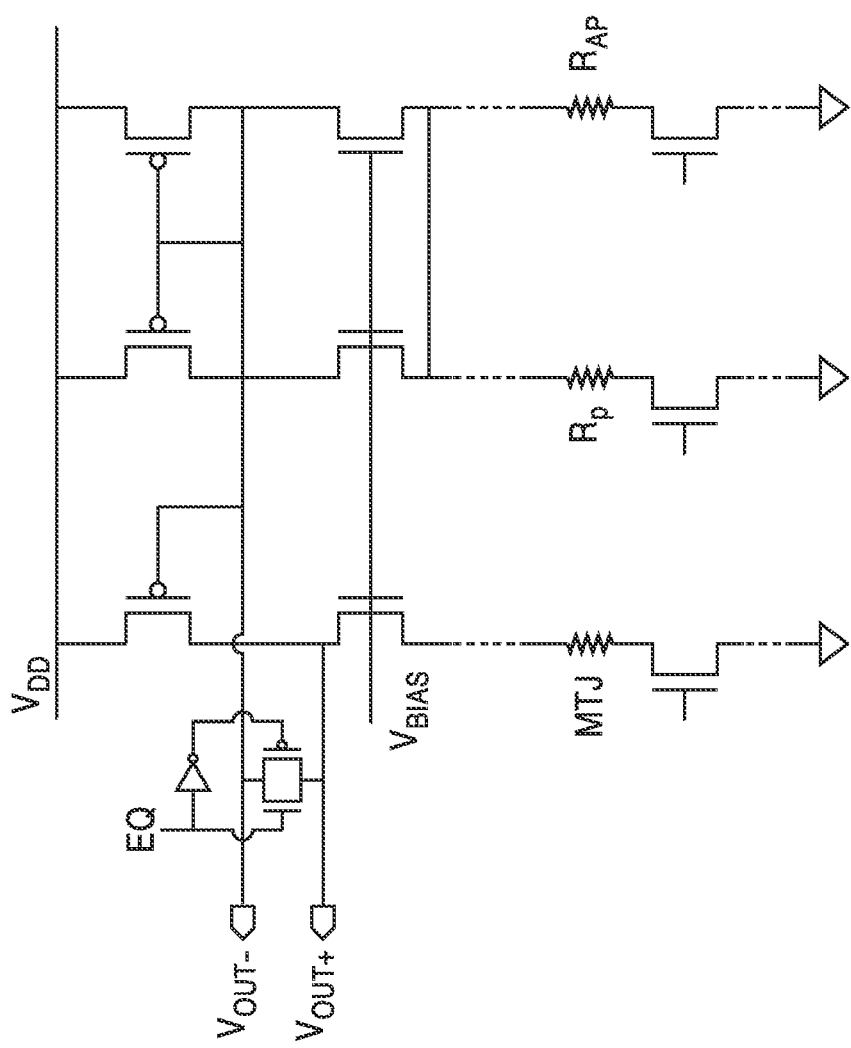
FIG. 1 is a schematic of a current-mirror sensing circuit (CMSC).
Figure 2:
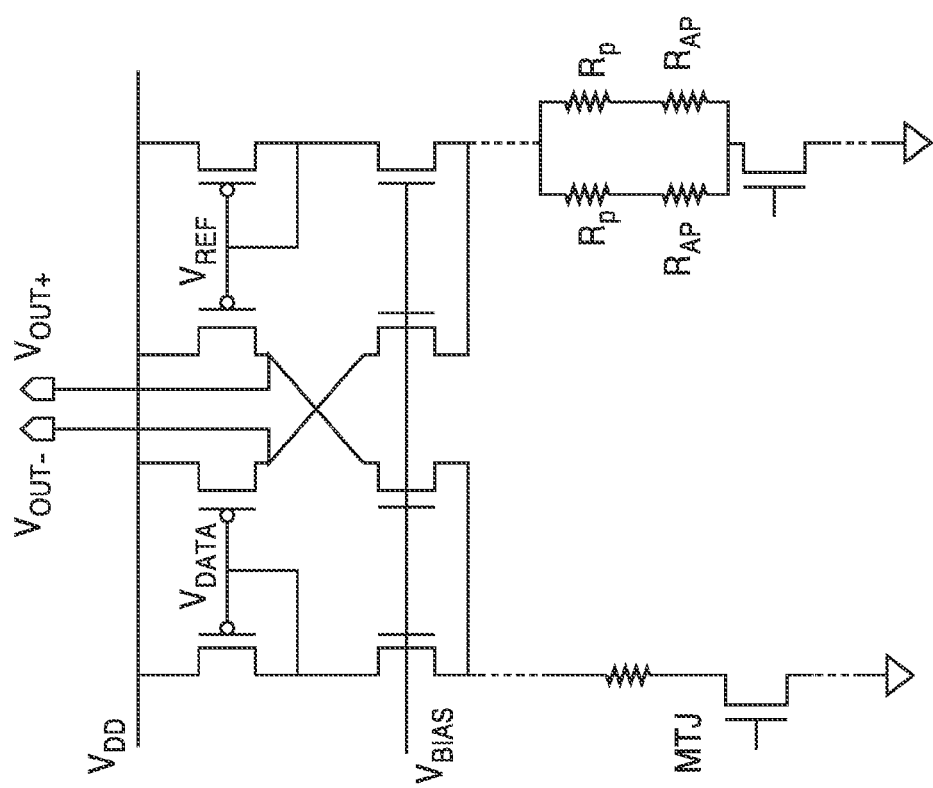
FIG. 2 is a schematic of a split-path sensing circuit.

In testing the inventive BVSC circuit, comparisons were performed against two recent memory designs that use a current-sensing scheme for reading. The first reference design is an improved current-mirror-based sensing circuit (GMSC) (see FIG. 1) which adds an equalizer to the sense amplifier outputs to mitigate the issues of the imbalanced output impedance and the skewed sensing time of reading $R_P$ and $R_{AP}$ of the original current-mirror sense-amplifier based design. The second reference design is a split-path sensing circuit (SPSC) (see FIG. 2). This SPSC design implements a double current-mirror based differential amplifier by splitting the sensing current into two paths and mirroring them differentially to improve the output signal swing and RM.

4. Read Margin (RM) Analysis

4.1. Definition of RM

In the SPR, pulse width determination for the sensing current is a key challenge. In order to avoid read errors, the disabling of the sensing circuit and enabling of the dynamic latch, should not be performed until a safe voltage signal has been established at the output of the sensing circuit. To be more specific, the pulse width of the sensing current should be determined based upon the sensing time required to guarantee the following condition.

$$|V_{OUT}|=|V_{DATA}-V_{REF}|\geq NM+V_{OS\_DL} \quad (3)$$

In the above equation, $V_{OS\_DL}$ is the input-referred offset voltage of the dynamic latch, and NM is the noise margin. However, the variation in the CMOS and MTJ device causes variations in both $V_{DATA}$ and $V_{REF}$. In order to validate the condition shown in Eq. (3), quantization is required of $V_{OUT}$ with a statistic measure of the margin between $V_{DATA}$ and $V_{REF}$ distribution. Therefore, $RM_P$ and $RM_{AP}$ are defined to be the worst case $V_{OUT}$ for reading $R_P$ and $R_{AP}$ with over 97.7% of the cases being better than them as given by the following equations. Similar to SM, the $V_{OUT}$ fluctuation, due to CMOS and MTJ variations, is statistically characterized by defining $RM_P$ and $RM_{AP}$ as $$RM_P=\mu(V_{OUT,P})+3\sigma(V_{OUT,P}) \quad (4)$$

and $$RM_{AP}=\mu(V_{OUT,AP})-3\sigma(V_{OUT,AP}) \quad (5)$$

Figure 9:
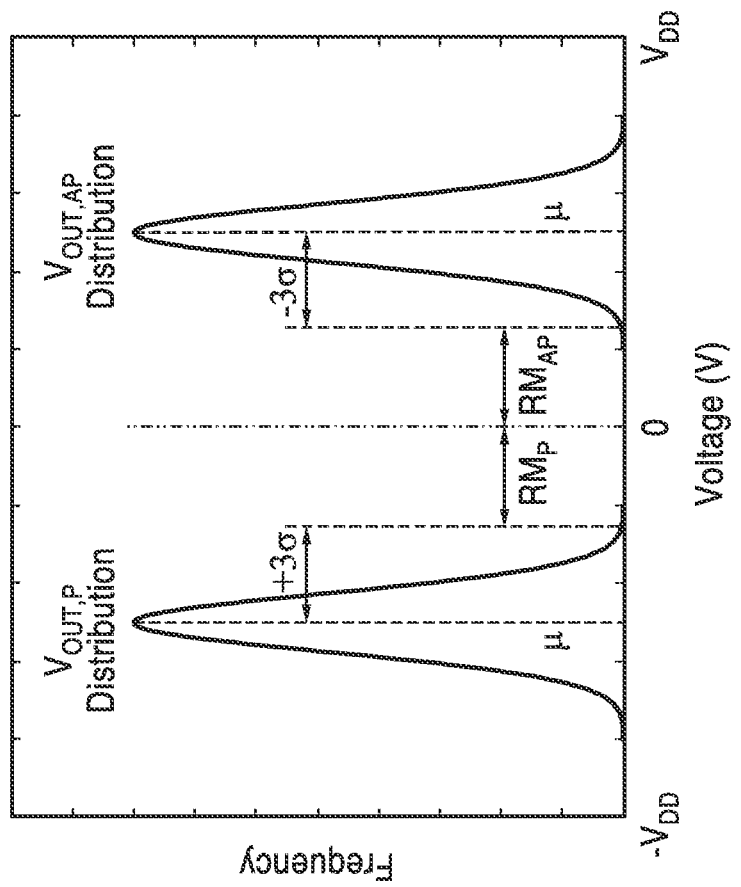
FIG. 9 is a graph of $V_{OUT,P}$ and $V_{OUT,AP}$ distribution for defining read margin (RM) according to elements of the present invention.

FIG. 9 depicts the definitions represented in Eq. (4) and Eq. (5). It should be noted that the $RM_P$ and $RM_{AP}$ have different polarities because $V_{OUT,P}$ and $V_{OUT,AP}$ have different polarities ($RM_{AP}>0$, $RM_P<0$), and it is the absolute value that represents the amplitude of the read margin. Using this definition, the overall RM is defined as the smaller of the two as follows.

$$RM=\min(|RM_P|,|RM_{AP}|) \quad (6)$$

It is important to note the difference between SM defined in Eq. (2) and RM defined here. SM characterizes the worst-case signal swing of the single-ended output of sensor circuits; while RM measures the worst-case signal amplitude of the differential outputs of the 2nd-stage amplifier, for reading $R_P$ and $R_{AP}$, respectively. With the RM definition in Eq. (6), the condition in Eq. (3) can be expressed as follows.

$$RM>NM+V_{OS\_DL} \quad (7)$$

According to Eq. (7), the higher the RM that a sensing circuit can achieve, the better the noise margin it can provide; although it also requires more sensing time to achieve the noise margin. In addition, the faster it takes to achieve a certain RM, the shorter the sensing current pulse which improves the SPR circuit. Therefore, one of the main objectives in designing the SPR circuit is to maximize RM of the sensing circuit.

4.2. Simulation Setup

The operation of the inventive BVSC circuit is compared with the two reference designs from the literature that adopt a current sensing scheme. The CMSC circuit improves a current mirror sense amplifier based design by adding an equalizer to the outputs to alleviate the impedance imbalance problem of the current mirror load, as well as to balance the sensing time for reading $R_P$ and $R_{AP}$. The SPSC circuit implements a double current mirror based differential amplifier by splitting the sensing current into two paths to further improve RM.

The RM, performance, and reliability of the three designs are compared using a 65 nm CMOS model with HSPICE simulations, with both the CMOS and MTJ variations considered. The MTJ model used in this study is summarized in Table 1. The MTJ variation is modeled using the standard deviation $\sigma_{RA}$ and $\sigma_{TMR}$ extracted from measurements. A total ±5 sigma variation of the MTJ is considered. Both the chip-to-chip and across chip local variations are taken into account in the CMOS model. The key design parameters, such as the size and bias voltage of critical transistors, and so forth, are first optimized using the built-in optimization tool in HSPICE for a target of maximizing the RM at 1 ns and 10 ns sensing time, under the same sensing current. The target sensing current $I_{MTJ,P}$ through the selected MTJ device was set at 50 µA for all of the three designs.

5. Simulation Results

FIG. 10A through FIG. 10F depict single-ended output voltage distribution of CMSC (FIG. 10A), SPSC (FIG. 10B), and BVSC (FIG. 10C), along with the differential output voltage distribution of CMSC (FIG. 10D), SPSC (FIG. 10E)

and BVSC (FIG. 10F) with 10 ns sensing time after $V_{OUT}$ is completely settled. The figure shows output voltage distribution of these three circuits after their outputs are completely settled (with 10 ns sensing time). RM is extracted according to Eqs. (4) and (5). The CMSC has the same $V_{OUT-}$ distribution for both reading $R_P$ and reading $R_{AP}$, due to the fact that $V_{OUT-}$ is directly generated from the reference cell in the CMSC. Consequently, the $V_{OUT}$ range of the CMSC is limited to $\pm V_{DD}/2$, and so is RM. The simulation results (FIG. 10A and FIG. 10D) show that the CMSC is only able to achieve a RM of 285 mV under a nominal 1V supply voltage. Alternatively, the $V_{OUT-}$ of the SPSC and BVSC can be generated from a differential amplification stage. This method can produce a $V_{OUT-}$ in complement to $V_{OUT+}$, thereby effectively doubling RM. However, the SPSC, with sensing and amplification performed in the same stage, has all the transistors in series with the memory cells. As a result, the voltage headroom limits its output swing, and subsequently the RM. In FIG. 10B and FIG. 10E it is seen that the SPSC is able to achieve a RM of over 520 mV under 1V $V_{DD}$. On the other hand, BVSC, with sensing and amplification performed in different stages, is shown (FIG. 10C and FIG. 10F) to have the highest RM that is over 620 mV under a 1V $V_{DD}$. With respect to CMSC and SPSC, BVSC has a RM improvement of 335 mV and 100 mV, respectively.

Figure 11:
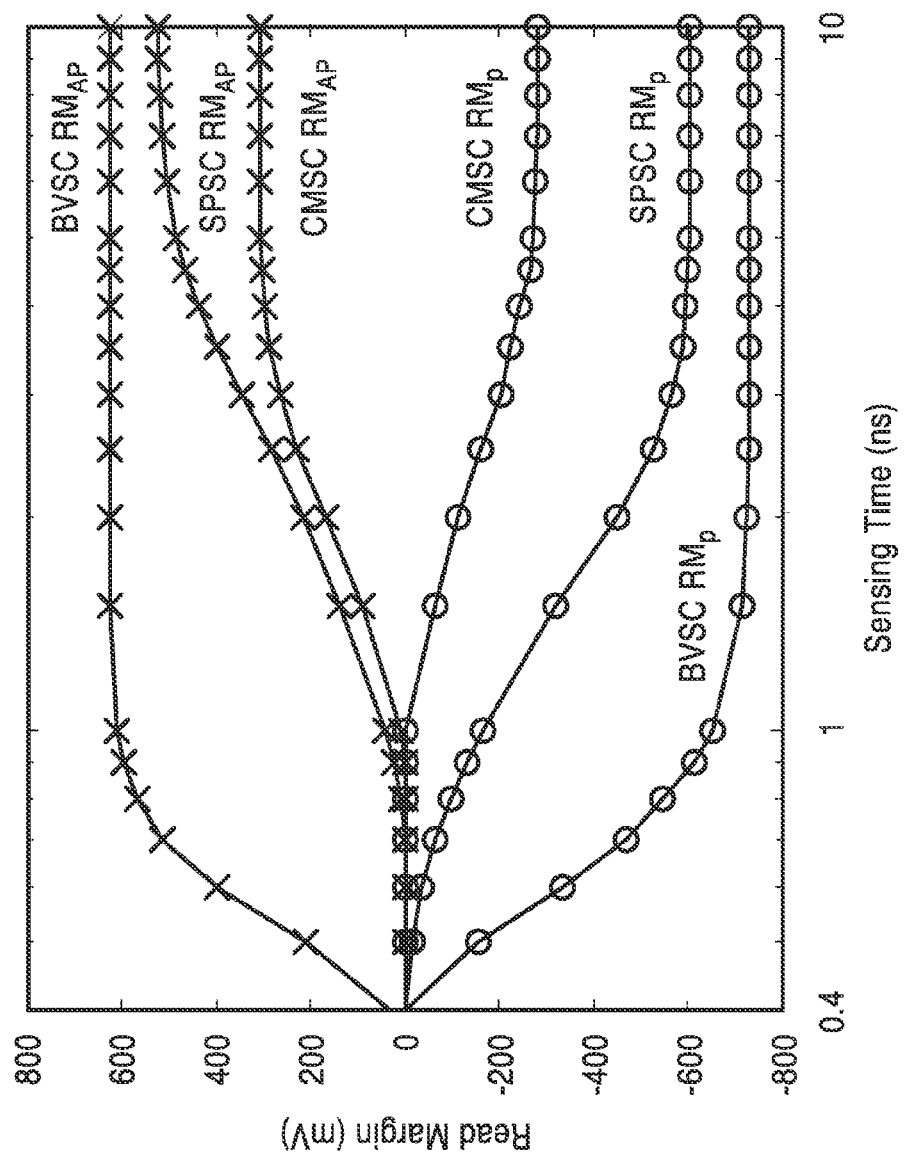
FIG. 11 is a graph of read margin (RM) versus sensing time according to an aspect of the present invention.

FIG. 11 depicts a comparison of RM with different sensing times, with RM calculated using Eq. (4), (5) and (6). The sensing time required for a certain RM is of practical interest to SPR which demands a faster and wider separation of RM curves. From this perspective, BVSC clearly shows the best suitability to SPR with great advantages in both RM and performance. CMSC has more balanced $RM_P$ and $RM_{AP}$, which results from the equalizer used at the outputs. However, the equalization phase also brings about 1 ns overhead in delay, reducing the effective RM of CMSC at short sensing times. SPSC has an improved RM as compared to CMSC, but the limited bandwidth at output nodes restricts its RM with a short sensing time as well. The results in FIG. 11 show that, with a 1 ns sensing time, the proposed BVSC is able to achieve over 600 mV RM in the nominal case. This RM is 2.2 and 1.3 times higher than that of CMSC and SPSC with sensing times of 5 ns, respectively.

It should be noted that additional testing of temperature variation showed little impact on performance for all the sensing circuits. In the worst case of temperature, performance degradation for CMSC, SPSC, and BVSC (for a RM level of 200 mV) is about 0.33 ns, 0.12 ns, and 0.01 ns, and the RM reduction is 6%, 4%, and 3%, respectively.

Figure 12B:
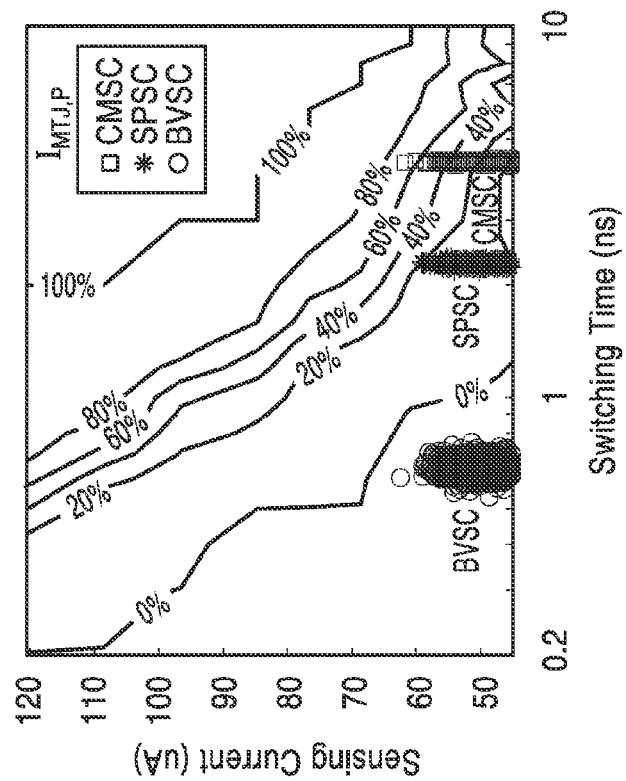
FIG. 12A and FIG. 12B are graphs of sensing current distributions for $I_{MTJ,P}$, and $I_{MTJ,AP}$, with scaled switching characteristic of the magnetic tunnel junction (MTJ) according to an aspect of the present invention.
Figure 12A:
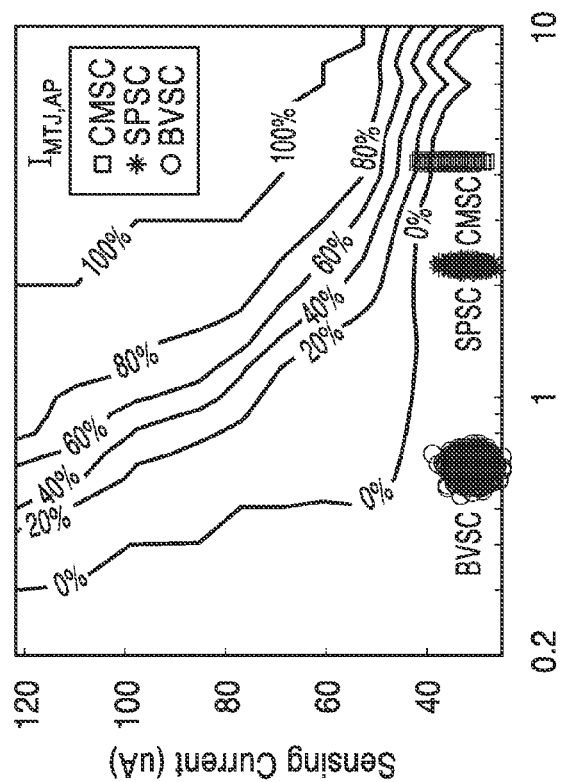

FIG. 12A and FIG. 12B depict sensing current distribution of the three circuits when operating with a 170 mV noise margin, plotted with the MTJ switching characteristic. To project the advantage of BVSC-based SPR circuit in future scaled STT-RAMS, it is assumed both $J_C$ and the size of the MTJ are scaled down by a factor of two. Clearly, the conventional reading techniques tend to be more destructive at such a level of scaling. With a similar amount of the sensing current ($I_{MTJ,P}$=50 μA), BVSC is able to operate with 3-7 times shorter sensing time, which significantly reduces the probability of read disturbance. Therefore, it appears BVSC is particularly well-suited for use with future advanced STT-RAMs.

Table 2 summarizes the sensing time required for achieving different RMs. Recalling the condition shown in Eq. (7), RM should be sufficiently large before starting the regeneration phase in order to overcome device variations and noise. Simulation results show that a small input-referred offset voltage ($\sigma(V_{OS\_DL})$<10 mV) can be achieved by properly sizing up the dynamic latch. By considering $\pm 3\sigma$ of the input-referred offset, a 200 mV RM is sufficient to guarantee a noise margin of around 170 mV. The worst-case sensing time required by the CMSC, SPSC, and BVSC to achieve this level of RM is 4.33 ns, 2.25 ns, and 0.65 ns, respectively. The proposed BVSC has significant speed advantage over CMSC and SPSC, and is able to provide over 300 mV RM at a GHz speed to enable practical application of the BVSC SPR apparatus and method.

Table 3 summarizes average sensing circuit power in the nominal case, and effective read energy per bit based on the worst-case sensing time required for a RM level of 200 mV (of Table 2). BVSC consumes more power than CMSC and SPSC, resulting from the use of the second-stage sense amplifier. However, due to the higher speed, the effective read energy per-bit required by BVSC is close to that of SPSC and much lower than that of CMSC. This indicates that the proposed BVSC is able to significantly boost read performance without sacrificing energy efficiency.

Additional testing provided information on the RM values as found in Table 4, which are compared to CMSC, SPSC and BVSC.

It should be noted that body-voltage sensing (BVSC) requires isolated N-wells for the PMOS transistors in sensor circuits, and requires additional transistors due to the second-stage amplifier. These elements result in a certain peripheral circuit area overhead, although the overall impact diminishes in proportion to the utilization rate of the memory.

6. Conclusions

The present invention teaches a body voltage sensing based SPR circuit as a solution to the high-speed reading of scaled STT-RAM technology. The body-connected load effectively improves the sensing margin and speed of the sensor circuits. A second stage amplifier further enhances the read margin of the sensing circuit and reduces the sensing time required for successful data latching. As a result, the proposed SPR circuit is able to perform reliable and high speed readings with the shortest current pulse reported to date applied on the MTJ device, and thereby has significant resistance to read disturbance. Compared to existing read circuit designs, the proposed SPR circuit features large improvements in both performance and read margin.

From the discussion above it will be appreciated that the invention can be embodied in various ways, including the following:

1. A body voltage based sense circuit (BVSC) apparatus for short pulse reading (SPR) of a memory, said apparatus comprising: a body voltage sensing data circuit configured to sense resistance of a memory cell that has two states, said body voltage sensing data circuit having a voltage output in response to short pulse reading (SPR) of said memory cell; said body voltage sensing data circuit configured to translate the states of the memory cell into a sense data voltage signal; a body voltage sensing reference circuit configured to generate a sense reference voltage signal; a second stage sense amplifier configured to compare said sense data voltage signal and said sense reference voltage signal and output a data signal; and a capturing latch circuit configured to capture said data signal using positive feedback; wherein said captured data signal digitally represents the state of said memory cell as a binary output; and wherein said body voltage sensing is performed on a body-connected load that provides a high sensing margin (SM) in which body and drain terminals of a transistor of said body voltage sensing data circuit are coupled together.

2. The apparatus of any of the preceding embodiments, wherein said body voltage sensing data circuit, said body voltage sensing reference circuit, and said second stage sense amplifier are configured for activation in response to receiving a sensing activation signal from memory control logic.

3. The apparatus of any of the preceding embodiments, wherein said capturing latch is configured for activation in response to receiving a latching activation signal from memory control logic.

4. The apparatus of any of the preceding embodiments, wherein sensing is enabled in response to receiving a sensing activation signal from memory control logic for a sensing time before receiving a latching activation signal from memory control logic, after which said data signal is output from said capturing latch as said binary output.

5. The apparatus of any of the preceding embodiments, wherein said body voltage sensing data circuit is configured for coupling to a memory cell in which memory state is retained by one or more magnetic tunnel junctions (MTJs).

6. The apparatus of any of the preceding embodiments, wherein each said memory cell comprises a magnetic tunnel junction (MTJ).

7. The apparatus of any of the preceding embodiments, wherein each magnetic tunnel junction (MTJ) comprises two ferromagnetic layers separated by a thin nonconductive tunneling barrier, and exhibit two resistive states determined by relative magnetization directions of the two ferromagnetic layers, with a parallel (P) orientation producing a low resistance ($R_P$) and an anti-parallel (AP) orientation producing a high resistance ($R_{AP}$).

8. The apparatus of any of the preceding embodiments, wherein said body voltage sensing data circuit is configured for operation within a spin-torque transfer random access memory (STT-RAM).

9. The apparatus of any of the preceding embodiments, wherein said body voltage sensing data circuit generates a sensing current during a read pulse that approximates current magnitude utilized when writing to said memory cell with a write pulse having a write pulse width, yet width of said read pulse is less than or equal to one-tenth of said write pulse width.

10. The apparatus of any of the preceding embodiments, wherein aid body voltage sensing data circuit provides a sensing margin on the order of 700 mV when utilizing a supply voltage under 1 Volt.

11. The apparatus of any of the preceding embodiments, wherein said body voltage sensing data circuit provides a 200 mV sensing margin at a sensing time of approximately 0.67 ns for 65 nm device geometry.

12. The apparatus of any of the preceding embodiments, wherein said body voltage sensing data circuit utilizes shorter current pulses for reading which increase read speed, while reducing read disturbance probability.

13. A body voltage based sense circuit (BVSC) apparatus for short pulse reading (SPR) of a memory, said apparatus comprising: a body voltage sensing data circuit for sensing resistance of a magnetic tunnel junction memory cell having two states, said body voltage sensing data circuit having a voltage output in response to short pulse reading (SPR) of said memory cell; said body voltage sensing data circuit configured to translate the states of the magnetic tunnel junction memory cell into a sense data voltage signal; a body voltage sensing reference circuit for sensing resistance of a reference magnetic tunnel junction memory cell and translating this into a sense reference voltage signal; a second stage sense amplifier configured to compare said sense data voltage signal and said sense reference voltage signal and output a data signal; and a capturing latch configured for capturing said data signal, as a captured data signal, using positive feedback; wherein said captured data signal digitally represents the state of said memory cell as a binary output; and wherein said body voltage sensing is performed on a body-connected load that provides a high sensing margin (SM) in which body and drain terminals of a transistor of said body voltage sensing data circuit are coupled together.

14. The apparatus of any of the preceding embodiments, wherein said body voltage sensing data circuit, said body voltage sensing reference circuit, and said second stage sense amplifier are configured for activation in response to receiving a sensing activation signal from memory control logic.

15. The apparatus of any of the preceding embodiments, wherein said capturing latch is configured for activation in response to receiving a latching activation signal from memory control logic.

16. The apparatus of any of the preceding embodiments, wherein sensing is enabled in response to receiving a sensing activation signal from memory control logic for a sensing time before receiving a latching activation signal from memory control logic, after which said data signal is output from said capturing latch as said binary output.

17. The apparatus of any of the preceding embodiments, wherein each magnetic tunnel junction (MTJ) comprises two ferromagnetic layers separated by a thin nonconductive tunneling barrier, and exhibits two resistive states determined by relative magnetization directions of ferromagnetic layers, with a parallel (P) orientation producing a low resistance ($R_P$) and an anti-parallel (AP) orientation producing a high resistance ($R_{AP}$).

18. The apparatus of any of the preceding embodiments, wherein said body voltage sensing data circuit is configured for operation within a spin-torque transfer random access memory (STT-RAM).

19. The apparatus of any of the preceding embodiments, wherein said body voltage sensing data circuit generates a sensing current during a read pulse that approximates current magnitude utilized when writing to said memory cell with a write pulse having a write pulse width, yet width of said read pulse is less than or equal to one-tenth of said write pulse width.

20. A body voltage based sense circuit (BVSC) apparatus for short pulse reading (SPR) of a spin-torque transfer random access memory (STT-RAM), said apparatus comprising: a body voltage sensing data circuit for sensing configured to sense resistance of a magnetic tunnel junction (MTJ) memory cell that has two states, said body voltage sensing data circuit having a voltage output in response to short pulse reading (SPR) of said MTJ memory cell; said body voltage sensing data circuit configured to translate the states of the MTJ memory cell into a sense data voltage signal; a body voltage sensing reference circuit for averaging high and low values of sensed voltage for a magnetic tunnel junction (MTJ) memory cell as a sense reference voltage signal; a second stage sense amplifier configured to compare said sense data voltage signal and said sense reference voltage signal and output a data signal; and a capturing latch circuit configured to capture said data signal using positive feedback; wherein said body voltage sensing is performed in response to a body-connected load that provides a high sensing margin (SM) in which body and drain terminals of a transistor of said body voltage sensing data circuit are coupled together.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Summary of MTJ Parameters

| Size | 50 nm × 130 nm |
|---|---|
| RA | 14.8 Ω · um² |
| TMR | 110% |
| $\sigma_{RA}$ | 4% |
| $\sigma_{TMR}$ | 5% |

TABLE 2

Sensing Time Required for Different RMs

| RM (mV) | Sensing Time (nS) | | |
|---|---|---|---|
| | CMSC | SPSC | BVSC |
| 100 | 1.96 | 1.48 | 0.57 |
| 200 | 4.33 | 2.25 | 0.65 |
| 300 | N/A | 3.16 | 0.78 |
| 400 | N/A | 4.41 | 1.0 |
| 500 | N/A | N/A | 1.72 |
| 600 | N/A | N/A | 3.64 |

TABLE 3

Average Power and Read Energy per bit

| | CMSC | SPSC | BVSC |
|---|---|---|---|
| Power (uW) | 135 | 80 | 300 |
| Energy/Bit (fJ) | 585 | 178.5 | 195.5 |

TABLE 4

$V_{MTJ}$-$V_{REF}$ Distribution on RM

| | RM voltage (mV) | | |
|---|---|---|---|
| | CMSA | SPSA | BVSA |
| $RM_P$ | −268 | −596 | −829 |
| $RM_{AP}$ | 303 | 432 | 696 |

What is claimed is:

1. A body voltage based sense circuit (BVSC) apparatus for short pulse reading (SPR) of a memory, said apparatus comprising:
a body voltage sensing data circuit configured to sense resistance of a memory cell that has two states, said body voltage sensing data circuit having a voltage output in response to short pulse reading (SPR) of said memory cell;
said body voltage sensing data circuit configured to translate the states of the memory cell into a sense data voltage signal;
a body voltage sensing reference circuit configured to generate a sense reference voltage signal;
a second stage sense amplifier configured to compare said sense data voltage signal and said sense reference voltage signal and output a data signal; and
a capturing latch circuit configured to capture said data signal using positive feedback;
wherein said captured data signal digitally represents the state of said memory cell as a binary output; and
wherein said body voltage sensing is performed on a body-connected load that provides a high sensing margin (SM) in which body and drain terminals of a transistor of said body voltage sensing data circuit are coupled together.

2. The apparatus recited in claim 1, wherein said body voltage sensing data circuit, said body voltage sensing reference circuit, and said second stage sense amplifier are configured for activation in response to receiving a sensing activation signal from memory control logic.

3. The apparatus recited in claim 2, wherein said capturing latch is configured for activation in response to receiving a latching activation signal from memory control logic.

4. The apparatus recited in claim 3, wherein sensing is enabled in response to receiving a sensing activation signal from memory control logic for a sensing time before receiving a latching activation signal from memory control logic, after which said data signal is output from said capturing latch as said binary output.

5. The apparatus recited in claim 1, wherein said body voltage sensing data circuit is configured for coupling to a memory cell in which memory state is retained by one or more magnetic tunnel junctions (MTJs).

6. The apparatus recited in claim 1, wherein each said memory cell comprises a magnetic tunnel junction (MTJ).

7. The apparatus recited in claim 6, wherein each magnetic tunnel junction (MTJ) comprises two ferromagnetic layers separated by a thin nonconductive tunneling barrier, and exhibit two resistive states determined by relative magnetization directions of the two ferromagnetic layers, with a parallel (P) orientation producing a low resistance ($R_P$) and an anti-parallel (AP) orientation producing a high resistance ($R_{AP}$).

8. The apparatus recited in claim 1, wherein said body voltage sensing data circuit is configured for operation within a spin-torque transfer random access memory (STT-RAM).

9. The apparatus recited in claim 1, wherein said body voltage sensing data circuit generates a sensing current during a read pulse that approximates current magnitude utilized when writing to said memory cell with a write pulse having a write pulse width, yet width of said read pulse is less than or equal to one-tenth of said write pulse width.

10. The apparatus recited in claim 1, wherein said body voltage sensing data circuit provides a sensing margin on the order of 700 mV when utilizing a supply voltage under 1 Volt.

11. The apparatus recited in claim 1, wherein said body voltage sensing data circuit provides a 200 mV sensing margin at a sensing time of approximately 0.67 ns for 65 nm device geometry.

12. The apparatus recited in claim 1, wherein said body voltage sensing data circuit utilizes shorter current pulses for reading which increase read speed, while reducing read disturbance probability.

13. A body voltage based sense circuit (BVSC) apparatus for short pulse reading (SPR) of a memory, said apparatus comprising:
- a body voltage sensing data circuit for sensing resistance of a magnetic tunnel junction memory cell having two states, said body voltage sensing data circuit having a voltage output in response to short pulse reading (SPR) of said memory cell;
- said body voltage sensing data circuit configured to translate the states of the magnetic tunnel junction memory cell into a sense data voltage signal;
- a body voltage sensing reference circuit for sensing resistance of a reference magnetic tunnel junction memory cell and translating this into a sense reference voltage signal;
- a second stage sense amplifier configured to compare said sense data voltage signal and said sense reference voltage signal and output a data signal; and
- a capturing latch configured for capturing said data signal, as a captured data signal, using positive feedback;
- wherein said captured data signal digitally represents the state of said memory cell as a binary output; and
- wherein said body voltage sensing is performed on a body-connected load that provides a high sensing margin (SM) in which body and drain terminals of a transistor of said body voltage sensing data circuit are coupled together.

14. The apparatus recited in claim 13, wherein said body voltage sensing data circuit, said body voltage sensing reference circuit, and said second stage sense amplifier are configured for activation in response to receiving a sensing activation signal from memory control logic.

15. The apparatus recited in claim 14, wherein said capturing latch is configured for activation in response to receiving a latching activation signal from memory control logic.

16. The apparatus recited in claim 15, wherein sensing is enabled in response to receiving a sensing activation signal from memory control logic for a sensing time before receiving a latching activation signal from memory control logic, after which said data signal is output from said capturing latch as said binary output.

17. The apparatus recited in claim 13, wherein each magnetic tunnel junction (MTJ) comprises two ferromagnetic layers separated by a thin nonconductive tunneling barrier, and exhibits two resistive states determined by relative magnetization directions of ferromagnetic layers, with a parallel (P) orientation producing a low resistance ($R_P$) and an anti-parallel (AP) orientation producing a high resistance ($R_{AP}$).

18. The apparatus recited in claim 13, wherein said body voltage sensing data circuit is configured for operation within a spin-torque transfer random access memory (STT-RAM).

19. The apparatus recited in claim 13, wherein said body voltage sensing data circuit generates a sensing current during a read pulse that approximates current magnitude utilized when writing to said memory cell with a write pulse having a write pulse width, yet width of said read pulse is less than or equal to one-tenth of said write pulse width.

20. A body voltage based sense circuit (BVSC) apparatus for short pulse reading (SPR) of a spin-torque transfer random access memory (STT-RAM), said apparatus comprising:
- a body voltage sensing data circuit for sensing configured to sense resistance of a magnetic tunnel junction (MTJ) memory cell that has two states, said body voltage sensing data circuit having a voltage output in response to short pulse reading (SPR) of said MTJ memory cell;
- said body voltage sensing data circuit configured to translate the states of the MTJ memory cell into a sense data voltage signal;
- a body voltage sensing reference circuit for averaging high and low values of sensed voltage for a magnetic tunnel junction (MTJ) memory cell as a sense reference voltage signal;
- a second stage sense amplifier configured to compare said sense data voltage signal and said sense reference voltage signal and output a data signal; and
- a capturing latch circuit configured to capture said data signal using positive feedback;
- wherein said body voltage sensing is performed in response to a body-connected load that provides a high sensing margin (SM) in which body and drain terminals of a transistor of said body voltage sensing data circuit are coupled together.

* * * * *